(12) United States Patent
Papandreou et al.

(10) Patent No.: US 9,496,031 B2
(45) Date of Patent: Nov. 15, 2016

(54) METHOD AND APPARATUS FOR FASTER DETERMINATION OF A CELL STATE OF A RESISTIVE MEMORY CELL USING A PARALLEL RESISTOR

(71) Applicant: INTERNATIONAL BUSINESS MACHINES CORPORATION, Armonk, NY (US)

(72) Inventors: Nikolaos Papandreou, Thalwil (CH); Charalampos Pozidis, Thalwil (CH); Abu Sebastian, Adliswil (CH); Milos Stanisavljevic, Adliswil (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/742,363

(22) Filed: Jun. 17, 2015

(65) Prior Publication Data

US 2015/0287456 A1 Oct. 8, 2015

Related U.S. Application Data

(63) Continuation of application No. 14/665,400, filed on Mar. 23, 2015, now Pat. No. 9,343,148.

(30) Foreign Application Priority Data

Mar. 26, 2014 (GB) .................................. 1405374.8

(51) Int. Cl.
*G11C 11/00* (2006.01)
*G11C 13/00* (2006.01)
*G11C 11/56* (2006.01)

(52) U.S. Cl.
CPC ......... *G11C 13/004* (2013.01); *G11C 11/5678* (2013.01); *G11C 13/0004* (2013.01); *G11C 2013/0057* (2013.01); *G11C 2213/79* (2013.01)

(58) Field of Classification Search
None
See application file for complete search history.

(56) References Cited

U.S. PATENT DOCUMENTS 7,426,134 B2  9/2008 Happ et al.
7,499,349 B2 *  3/2009 Roehr ..................... G11C 7/14
                                                    365/148

(Continued)

FOREIGN PATENT DOCUMENTS

EP      1901307 A2     3/2008
WO   2012167456 A1    12/2012

OTHER PUBLICATIONS

List of IBM Patents or Patent Applications Treated as Related.
(Continued)

*Primary Examiner* — Son Dinh
*Assistant Examiner* — Sultana Begum
(74) *Attorney, Agent, or Firm* — Tutunjian & Bitetto, P.C.; David M. Quinn

(57) ABSTRACT

A device for determining an actual cell state of a resistive memory cell having a plurality M of programmable cell states comprising a sensing circuit, a settling circuit, a prebiasing circuit, and a resistor coupled in parallel to the resistive memory cell, wherein the resistor is configured to reduce an effective resistance seen by the prebiasing circuit. The sensing circuit is configured to sense a sensing voltage of the resistive memory cell and output a resultant value in response to the sensing voltage which is indicative for the actual cell state. The settling circuit is configured to settle the sensing voltage to a certain target voltage representing one of the M programmable cell states. The prebiasing circuit is configured to prebias a bitline capacitance of the resistive memory cell such the sensing voltage is close to the certain target voltage.

10 Claims, 12 Drawing Sheets

(56) References Cited

U.S. PATENT DOCUMENTS

| | | | |
|---|---|---|---|
| 7,692,979 B2 | 4/2010 | Fuji et al. | |
| 8,320,171 B2 | 11/2012 | Park | |
| 8,755,214 B2 | 6/2014 | Frey et al. | |
| 8,780,611 B2 | 7/2014 | Frey et al. | |
| 2004/0170048 A1 | 9/2004 | Hsu | |
| 2006/0034112 A1 | 2/2006 | Oh et al. | |
| 2007/0103972 A1 | 5/2007 | Ro et al. | |
| 2007/0140029 A1 | 6/2007 | Kim et al. | |
| 2008/0025089 A1 | 1/2008 | Scheuerlein et al. | |
| 2008/0080228 A1 | 4/2008 | Nirschl et al. | |
| 2008/0165570 A1 | 7/2008 | Happ et al. | |
| 2008/0239833 A1 | 10/2008 | Nirschl et al. | |
| 2008/0316803 A1 | 12/2008 | Lin et al. | |
| 2010/0103726 A1* | 4/2010 | Bae | G11C 5/143 365/163 |
| 2011/0103140 A1 | 5/2011 | Chung | |
| 2011/0170332 A1 | 7/2011 | Oh et al. | |
| 2012/0307554 A1 | 12/2012 | Frey et al. | |
| 2012/0314481 A1 | 12/2012 | Close et al. | |
| 2014/0078820 A1 | 3/2014 | Li et al. | |

OTHER PUBLICATIONS

Wong, H.S.P., et al., "Phase Change Memory," Proceedings of the IEEE, vol. 98, No. 12, Dec. 2010. (pp. 2201-2227).

Wong, H.S.P., et al., "Metal—Oxide RRAM," Proceedings of the IEEE, vol. 100, No. 6, Jun. 2012. (pp. 1951-1970).

* cited by examiner

METHOD AND APPARATUS FOR FASTER DETERMINATION OF A CELL STATE OF A RESISTIVE MEMORY CELL USING A PARALLEL RESISTOR

RELATED APPLICATION DATA

This application is a Continuation application of co-pending U.S. patent application Ser. No. 14/665,400 filed on Mar. 23, 2015, which claims priority under 35 U.S.C. §119 from United Kingdom Patent Application No. 1405374.8 filed Mar. 26, 2014, both of which are incorporated herein by reference in their entirety.

BACKGROUND

1. Technical Field

The invention generally relates to a device and method for determining an actual cell state of a resistive memory cell having a plurality of programmable cell states.

2. Description of the Related Art

A prominent example for resistive memory cells having a plurality of programmable levels or states is Resistive Random Access Memory ("RRAM"), in particular Phase Change Memory ("PCM"). PCM is a non-volatile solid-state memory technology that exploits the reversible, thermally-assisted switching of specific chalcogenides between certain states of different electrical conductivity.

PCM is a promising and advanced emerging non-volatile memory technology mainly due to its excellent features including low latency, high endurance, long retention and high scalability. PCM may be considered a prime candidate for Flash replacement, embedded/hybrid memory and storage-class memory. Key requirements for competitiveness of PCM technology may be multi-level cell functionality, in particular for low cost per bit, high-speed read/write operations, in particular for high bandwidth and high endurance. Multilevel functionality, i.e., multiple bits per PCM cell, may be a way to increase storage capacity and thereby reduce cost.

Multi-level PCM is based on storing multiple resistance levels between a lowest ("SET") and a highest ("RESET") resistance value. Multiple resistance levels correspond to partial-amorphous and partial-crystalline phase distributions of the PCM cell. Phase transformation, i.e., memory programming, may be enabled by Joule heating. In this regard, Joule heating may be controlled by a programmed current or voltage pulse. Storing multiple resistance levels in a PCM cell is a challenging task.

For example, in "Phase Change Memory," by H. S. P. Wong, et al., multiple states or levels in a PCM cell are created by varying the programming power, thus creating different crystalline and amorphous fractions within the cell. Further, according to "Metal Oxide RRAM," by H. S. P. Wong, et al., in metal-oxide resistive memory devices, multiple states may correspond to variations in the gap between conductive oxygen-vacancy filaments and the electrodes.

As mentioned above, in resistive memory, the fundamental storage unit (referred to generally herein as the "cell") can be set to a number of different states which exhibit different electrical resistance characteristics. Information is recorded by exploiting the different states to represent different data values. To read recorded data, cell-state is detected via measurements which exploit the differing resistance characteristics to differentiate between possible cell-states. A variety of semiconductor memory technologies employ these basic principles for data storage. Examples include oxide-based memory such as resistive RAM and memristor memory, ionic-transport-based memory, and phase-change memory. The following discussion will focus on phase-change memory ("PCM") as a particularly promising technology for future non-volatile memory chips. It is to be understood, however, that PCM is only an illustrative application for the invention to be described which can be similarly applied to other resistive memory technologies.

Phase-change memory exploits the reversible switching of certain chalcogenide materials between at least two states with different electrical resistance. In so-called "single-level cell" ("SLC") PCM devices, each cell can be set to one of two states, crystalline and amorphous, by application of heat. Each SLC cell can thus store one bit of binary information. However, to satisfy market demand for ever-larger memory capacity and reduce cost per bit, storage of more than one bit per cell is required. To achieve this, it is necessary that a cell can be set to s states where s>2, and that these states can be distinguished on readback via the cell resistance characteristics. Multi-level cell ("MLC") operation has been proposed for PCM cells whereby each cell can be set to one of s>2 resistance levels, each corresponding to a different cell state. MLC operation is achieved by exploiting partially-amorphous states of the chalcogenide cell. Different cell states are set by varying the effective volume of the amorphous phase within the chalcogenide material. This, in turn, varies cell resistance.

To write data to a PCM cell, a voltage or current pulse is applied to the cell to heat the chalcogenide material to an appropriate temperature to induce the desired cell-state on cooling. By varying the amplitude of the voltage or current pulses, different cell-states can be achieved. Reading of PCM cells can be performed using cell resistance to distinguish the different cell-states. The resistance measurement for a read operation is performed in the sub-threshold region of the current-versus-voltage ("IN") characteristic of the cell, i.e., in the region below the threshold switching voltage at which a change in cell-state can occur. The read measurement can be performed in a variety of ways, but all techniques rely fundamentally on either voltage biasing and current sensing, or current biasing and voltage sensing. In a simple implementation of the current-sensing approach, the cell is biased at a certain constant voltage level and the resulting cell current is sensed to provide a current-based metric for cell-state. U.S. Pat. No. 7,426,134 B2 discloses one example of a current-sensing technique in which the bias voltage can be set to successive higher levels, and the resulting cell-current compared to successive reference levels, for detecting the different cell-states. U.S. Patent Publication No. 2008/0025089 discloses a similar technique in which the cell current is simultaneously compared with different reference levels. In the alternative, voltage-sensing approach, a constant current is passed through the cell and the voltage developed across the cell is sensed to provide a voltage-based metric for cell-state.

Reading of MLC cells is particularly challenging as the read operation involves distinguishing fine differences in cell resistance via the current/voltage measurements. Compared to SLC operation, these fine differences are more readily affected by random noise fluctuations and drift over time, resulting in errors when retrieving stored data. To counteract this loss of data integrity associated with MLC memory, new cell-state metrics, beyond simple resistance, have been proposed. Co-pending European Patent Application No. 10174613.9, filed Aug. 31, 2010, discloses a particularly promising metric which is based on the sub-threshold slope of the I/V characteristic of the cell. For example, the metric may be based on the difference between two read measurements of the same cell. This type of metric is less sensitive to noise and drift. In certain embodiments of this measurement technique, the metric is essentially a voltage based metric in the sense that it calls for the measurement of cell voltages (or cell voltage differences) at given bias currents. In general, voltage-based metrics are considered advantageous over current-based metrics, showing less drift over time, less susceptibility to noise, better signal-to-noise ratio ("SNR"), and allowing more intermediate levels to be packed into one cell. However, the conventional technique for obtaining voltage-based metrics, using current biasing and voltage sensing, is undesirably slow as explained above. This speed penalty associated with the conventional voltage measurement technique means that there is a fundamental conflict between the requirement for a fast random access of the memory and the need for voltage-based metrics supporting high density MLC memory.

Recapitulating, the readout of the cell state may be done via a current-based metric or via a voltage-based metric.

Accordingly, it is an aspect of the present invention to improve the determining of the actual cell state of a resistive memory cell having a plurality of programmable cell states.

SUMMARY

According to an embodiment of a first aspect, a device for determining an actual cell state of a resistive memory cell having a plurality M of programmable cell states is suggested. The device comprises a sensing circuit, a settling circuit, a prebiasing circuit, and a resistor coupled in parallel to the resistive memory cell, wherein the resistor is configured to reduce an effective resistance seen by the prebiasing circuit. The sensing circuit is configured to sense a sensing voltage of the resistive memory cell and to output a resultant value in response to the sensing voltage which is indicative for the actual cell state. The settling circuit is configured to settle the sensing voltage to a certain target voltage representing one of the M programmable cell states. The prebiasing circuit is configured to prebias a bitline capacitance of the resistive memory cell such the sensing voltage is close to the certain target voltage.

According to some implementations, the resistive memory cell is a PCM cell (PCM, Phase Change Memory). The PCM cell may be understood as a non-linear resistive device. In particular, the memory cells and/or the reference cells form a memory array.

The present device may provide a faster readout scheme specifically optimized for voltage-based metrics.

The particular elements of the parallel resistor and the prebiasing circuit may allow a faster readout of voltage-based cell state metrics compared to conventional schemes.

The inherent slowness of current biasing originates in a large charging time constant due to the high parasitic bitline capacitance and the high resistance of the memory cell, in particular in a cell state having a higher or highest resistance value. Since the bitline capacitance may not be compensated by the present sensing circuitry, a large time-constant can be reduced by reducing the effective resistance seen by the prebiasing circuit (also called current biasing source). By adding the resistor of a particularly optimized value in the readout circuit in parallel to the memory cell, the maximum resistance and therefore the maximum settling time can be significantly reduced with only a slight change of the effective detection current curve. Here, the sensing value for the given amorphous thickness is similar to the value obtained by direct voltage-based sensing.

For example, by prebiasing the memory cell from a voltage source of the prebiasing circuit in a particular manner, the settling time may be further reduced, for example for two to three times. The sensing of the proposed scheme may offer the possibility of storing memory levels with a better separation and also better tolerance of drift phenomenon present in phase-change memories.

According to some implementations, two key parameters for the detection curve for determining the actual cell state, namely the resistance of the parallel resistor and the sourcing current of the settling circuit may be trimmed as follows: First, the sourcing current is chosen according to the maximum acceptable SET current so that the detection curve is always below a threshold current. Next, the resistance of the parallel resistor is chosen as a minimum value that satisfies the condition of a maximum sensing voltage corresponding to the product of the resistance of the parallel resistor and the sourcing current slightly higher than the maximum required sensing voltage (and smaller than the minimum threshold voltage). Next, the prebiasing voltage and the prebiasing duration are selected to minimize the settling time particularly in the RESET state and to limit the maximum readout voltage in the SET state.

According to some further implementations, the cell state is roughly checked and the bitline is biased on the highest possible voltage that doesn't induce threshold switching since discharging (prebiasing voltage is higher than the final sensing voltage) through the resistive memory cell is fast (faster than through equivalent resistor) due to its non-linear characteristic.

For example, the total latency time using the present device may be about only 200 ns, including 90 ns for prebiasing, 50 ns for the settling time, and 60 ns for the analog-to-digital conversion.

In one embodiment, a resistance of the resistor is at least five times smaller than a highest sensing resistance value of the resistive memory cell. In particular, the resistance of the resistor is between five and fifteen times smaller than the highest resistance value of the resistive memory cell.

Because of this small resistance of the resistor, the effective resistance seen by the prebiasing circuit can be minimized.

In a further embodiment, the prebiasing circuit is coupled to a first node connected to the bitline of the resistive memory cell and to the resistor.

In a further embodiment, a controller is configured to control a number of switches such that, in a prebiasing phase, the prebiasing circuit is connected to the first node and, in a settling phase, the settling circuit is connected to the first node and the prebiasing circuit is disconnected from the first node.

In a further embodiment, a comparator is configured to provide a comparison result based on comparing a first current flowing through the resistive memory cell and the resistor coupled in parallel to the resistive memory cell and a second current provided by a current mirror of the settling device.

In particular, in the prebiasing phase, the device is in a prebiasing mode. In an analogous way, in the settling phase, the device is in a settling mode. In particular, the prebiasing phase is directly before the settling phase.

In a further embodiment, the controller is configured to control the number of switches such that the prebiasing circuit is connected to the first node as long as the comparison result indicates that the first current is smaller than the second current, and such that the settling circuit is connected to the first node and the prebiasing circuit is disconnected from the first node if the comparison result indicates that the first current is greater than or equal to the second current.

Advantageously, the comparison result is used for deciding on the operation mode of the device, e.g., using the prebiasing mode, the settling mode or a sampling mode for sampling the sensing voltage.

For example, the controller is configured to feed, during the prebiasing phase, a number N of gradual rising biasing voltages to the prebiasing circuit.

In a further embodiment, the number N of gradual rising biasing voltages includes a minimum biasing voltage corresponding to a maximum voltage allowed for the cell state having the lowest resistance value, a maximum biasing voltage corresponding to a maximum sensing voltage and N−2 gradual voltage steps between the minimum biasing voltage and the maximum biasing voltage.

In a further embodiment, the comparator is a voltage comparator which is configured to provide the comparison result by comparing an output voltage provided by the current mirror of the settling device and a reference voltage.

In a further embodiment, the prebiasing circuit includes a voltage regulator being coupleable by a first switch to a second node connected to the settling circuit and being coupleable by a second switch to the first node.

In particular, the voltage regulator is connected to the second node by means of the first switch. Further, the voltage regulator may be connected to the first node by means of the second switch.

In a further embodiment, the prebiasing circuit includes a serial connection of a voltage source, a resistor and a switch for connecting and disconnecting the prebiasing circuit to the first node. This embodiment of the prebiasing circuit has a simple circuitry.

In a further embodiment, the resistor coupled in parallel to the resistive memory cell and the resistor of the prebiasing circuit have identical resistant values.

Any embodiment of the first aspect may be combined with any embodiment of the first aspect to obtain another embodiment of the first aspect.

According to an embodiment of a second aspect, a resistive memory device is suggested. The resistive memory device comprises a memory including a plurality of resistive memory cells each having a plurality M of programmable levels, and a read/write apparatus for reading and writing data in the resistive memory cells, wherein the read/write apparatus includes a device of embodiments of the above mentioned first aspect.

According to an embodiment of a third aspect, a method for determining an actual cell state of a resistive memory cell having a plurality M of programmable cell states is suggested. The method includes the following steps: coupling a prebiasing circuit with the resistive memory cell, coupling a resistor in parallel to the resistive memory cell such that the resistor is configured to reduce an effective resistance seen by the prebiasing circuit, prebiasing a bitline capacitance of the resistive memory cell by the prebiasing circuit such a sensing voltage of the resistive memory cell is close to a certain target voltage which is indicative for the actual cell state, settling the sensing voltage to the certain target voltage, sensing a sensing voltage of the resistive memory cell, and outputting a resultant value in response to the sensing voltage. In particular, the resultant value is a digital value.

According to an embodiment of a fourth aspect, the invention relates to a computer program comprising a program code for executing at least one step of the method of the third aspect for determining an actual cell state of a resistive memory cell when run on at least one computer.

According to some implementations, the present circuit realization of the device is even simpler than in typical current-based metric realizations. One reason is that key problematic blocks are not necessary. Further, the input range may be quite linear. Thus, any kind of fast analog-to-digital converter may be used.

According to some further implementations, a higher sensing current for the SET state enables a higher sensing voltage than in a direct voltage-based metric which eliminates the problem of low voltage sensing. The higher sensing current for intermediate values may reduce noise.

According to some further implementations, the maximum sensing voltage of the RESET state is lower than in case of direct voltage-based metrics. It may be trimmed and may work as a natural limiter under the threshold voltage.

According to some further implementations, the prebiasing circuit may work as a natural limiter for maximum current/voltage in the prebiasing phase.

In the following, exemplary embodiments of the present invention are described with reference to the enclosed figures.

BRIEF DESCRIPTION OF THE DRAWINGS

Similar or functionally similar elements in the figures have been allocated the same reference signs if not otherwise indicated.

DETAILED DESCRIPTION OF THE EMBODIMENTS

Figure 1:
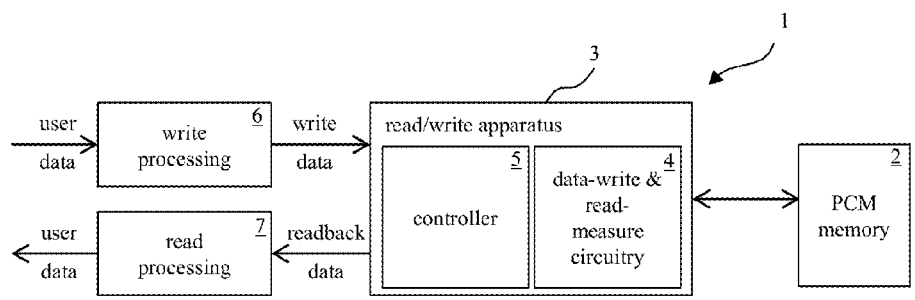
FIG. 1 shows an embodiment of a resistive memory device in accordance with the present principles.

FIG. 1 is a simplified schematic of a resistive memory device 1. The resistive memory device 1 includes a phase-change memory 2 for storing data in one or more integrated arrays of multilevel PCM cells. Though shown as a single block in FIG. 1, generally memory 2 may include any desired configuration of PCM storage units ranging, for example, from a single chip or die to a plurality of storage banks each containing multiple packages of storage chips. Reading and writing of data to memory 2 is performed by read/write apparatus 3. Apparatus 3 includes datawrite and read-measurement circuitry 4 for writing data to the PCM cells and for making cell measurements allowing determination of cell state and hence readback of stored data.

Circuitry 4 can address individual PCM cells for write and read purposes by applying appropriate voltage signals to an array of word and bit lines in memory ensemble 2.

This process is performed in generally known manners except as detailed hereinafter. A read/write controller 5 controls operation of apparatus 3 generally and in particular controls measurement operations in the embodiments to be described, as well as processing of measurements for determining cell state, i.e., level detection, where required. In general, the functionality of controller 5 can be implemented in hardware or software or a combination thereof, though use of hardwired logic circuits is generally preferred for reasons of operating speed. Suitable implementations will be apparent to those skilled in the art from the description herein. As indicated by block 6 in FIG. 1, user data input into device 1 is typically subjected to some form of write-processing, such as coding for error-correction purposes, before being supplied as write data to read/write apparatus 3. Similarly, readback data output by apparatus 3 is generally processed by a read-processing module 7, e.g., performing codeword detection and error correction operations, to recover the original input user data. Such processing by modules 6 and 7 is independent of the cell-state measurement system to be described and need not be discussed further here.

Each of the multilevel cells in memory 2 can be set to one of s resistance levels, where s>2, corresponding to different amorphous/crystalline states of the cell. To write data to memory cells, circuitry 4 applies programming pulses (via cell bit-lines or word-lines depending on whether voltage-mode or current-mode programming is used) of appropriate amplitude to set cells to states representative of the write data. Subsequent reading of a memory cell involves determining the state of the cell, i.e., detecting which of the possible levels that cell is set to. In a read operation of memory device 1, circuitry 4 performs cell measurements from which cell-states can be determined and the stored data recovered.

Figure 2:
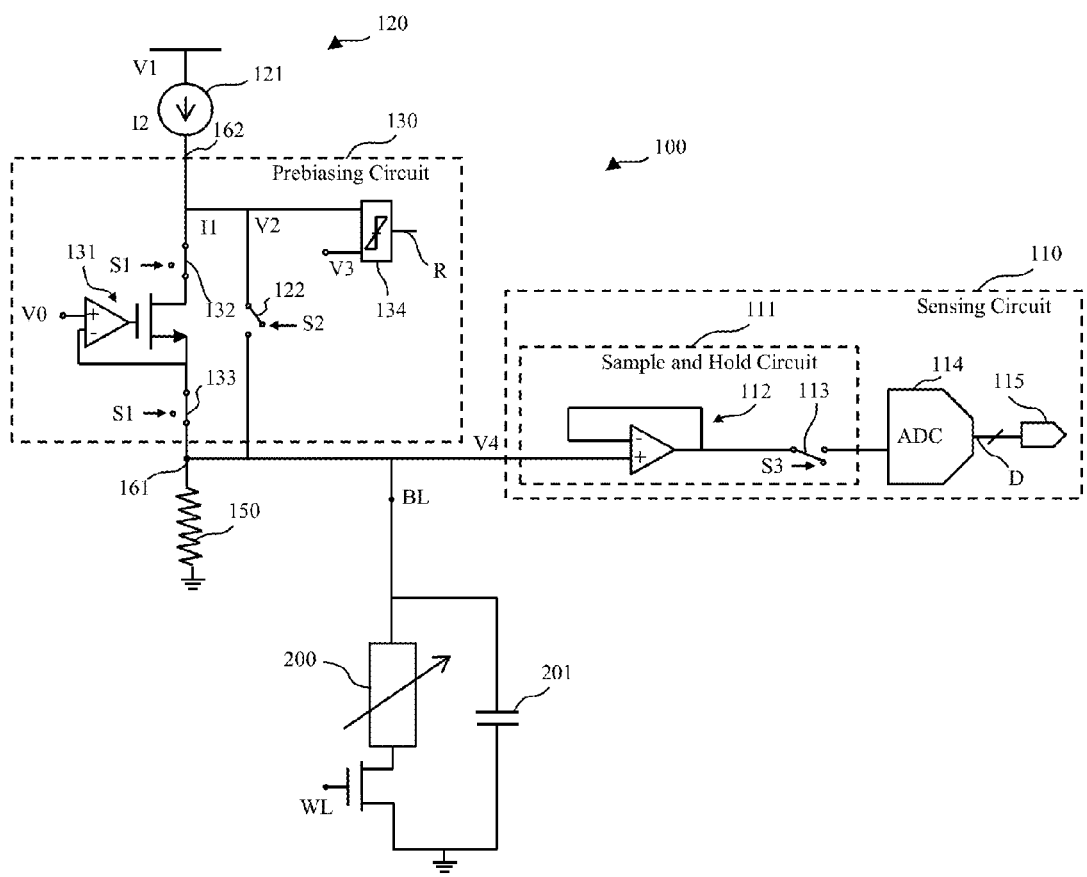
FIG. 2 shows a first embodiment of a device for determining an actual cell state of a resistive memory cell in a prebiasing mode in accordance with the present principles.

In FIG. 2, a first embodiment of a device 100 for determining an actual cell state of a resistive memory cell 200 in a prebiasing mode is depicted.

The device 100 of FIG. 2 has a sensing circuit 110, a settling circuit 120, a prebiasing circuit 130 and a resistor 150. The resistor 150 is coupled in parallel to the resistive memory cell 200. For example, the resistive memory cell 200 is a PCM cell having a plurality M of programmable cell states.

The sensing circuit 110 is configured to sense a sensing voltage V4 of the resistive memory cell 200 and to output a resultant value D (e.g., a digital value D) in response to the sensing voltage V4. The sensing voltage V4, and therefore also the resultant value D, are indicative for the actual cell state.

The sensing circuit 110 includes a sample and hold circuit 111, an analog-to-digital converter ("ADC") 114 and an output 115. The sample and hold circuit 111 includes a buffer 112 and a switch 113 controlled by control signal S3.

The settling circuit 120 is configured to settle the sensing voltage V4 to a certain target voltage representing one of the M programmable cell states. The settling circuit 120 is coupled to a supply voltage V1 and includes a current mirror 121.

The prebiasing circuit 130 of FIG. 2 is coupled between the current mirror 121 and a first node 161. The bitline BL of the PCM cell 200 is connected to the first node 161. The resistor 150 is coupled in parallel to the resistive memory cell 200 and therefore also connected to the first node 161. The resistive memory cell 200 includes a bitline BL, a bitline capacitance 201 and a wordline WL.

The resistance of the resistor 150 is at least 5 times smaller than a highest resistance value of the resistive memory cell 200. For example, the resistance of the resistor 150 is between 5 and 15 times smaller than a highest resistance value of the resistive memory cell 200.

The prebiasing circuit 130 of FIG. 2 includes a voltage regulator 131 which is coupled to a second node 162 connected to the settling circuit 120 by a first switch 132. Furthermore, the prebiasing circuit 130 is coupled to the first node 161 by a second switch 133.

Further, the device 100 includes a controller for controlling the switches 122, 132, 133 and 113. As an alternative, the device 100 is coupled to a controller 5 as shown in FIG. 1. The controller 5 is configured to control the number of switches 122, 132, 133 such that, in a prebiasing phase (or prebiasing mode), the prebiasing circuit 130 is connected to the first node 161 and, in a settling phase (or settling mode), the settling circuit 120 is connected to the first node 161 and the prebiasing circuit 130 is disconnected from the first node 161 and second node 162.

The controller 5 may control the switches 132 and 133 by a first control signal S1. Furthermore, the controller 5 may control the switch 122 by a second control signal S2. The control signals S1 and S2 may be complementary signals. Moreover, the controller 5 may control switch 113 by the third control signal S3.

Moreover, the prebiasing circuit 130 may include a comparator 134 for providing a comparison result R based on comparing a first current I1 flowing through the resistive memory cell 200 and the resistor 150 and a second current I2 provided by the current mirror 121.

In the example of FIG. 2, the comparator 134 is a voltage comparator 134. The voltage comparator 134 may be configured to provide the comparison result R by comparing an output voltage V2 provided by the current mirror 121 and a reference voltage V3 (e.g., V3=0.5V1).

Figure 3A:
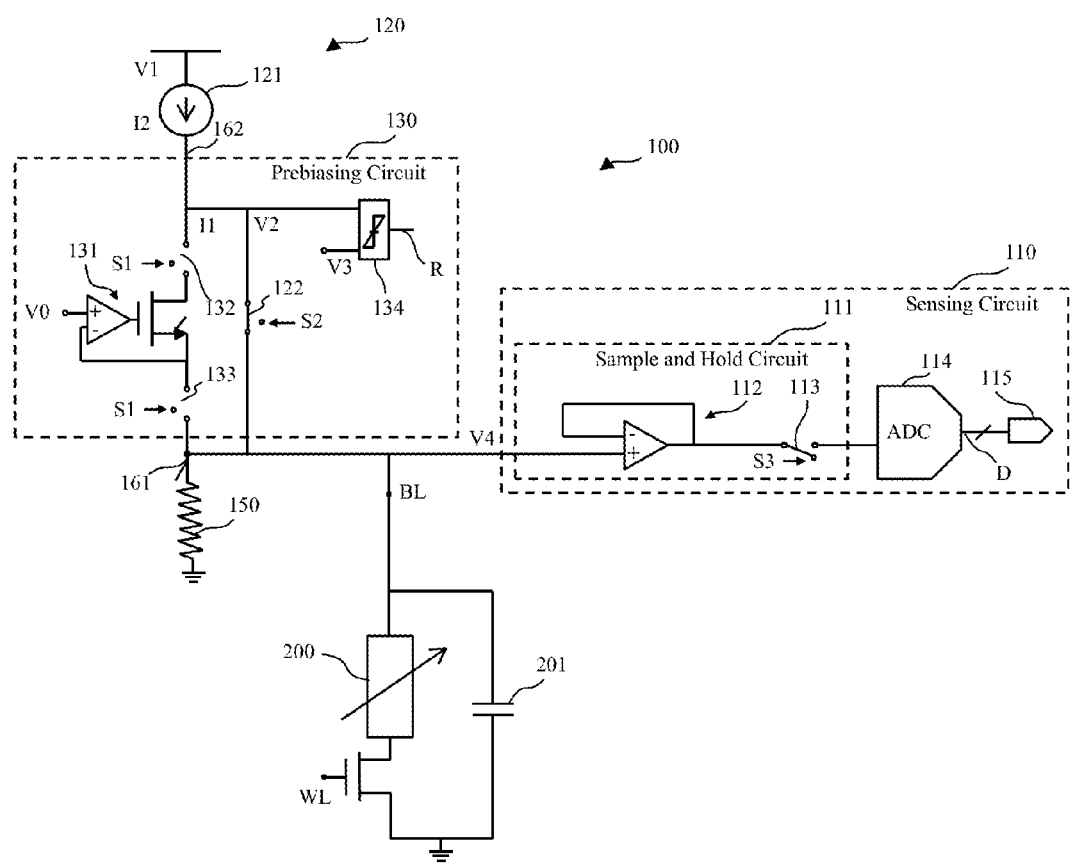
FIG. 3A shows the first embodiment of the device of FIG. 2 in a settling mode in accordance with the present principles.
Figure 3B:
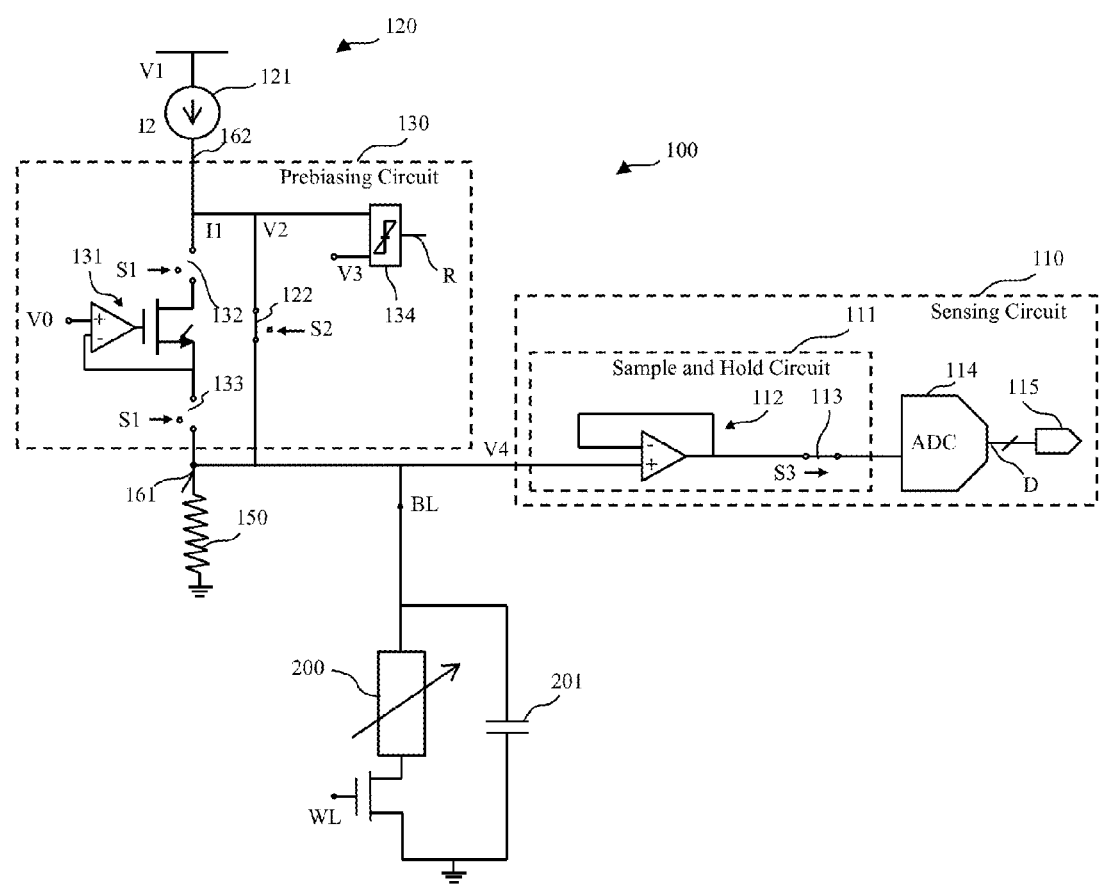
FIG. 3B shows the first embodiment of the device of FIG. 2 in a sampling mode in accordance with the present principles.

In dependence on the comparison result R, the device 100 may be in a prebiasing mode (FIG. 2), or in a settling mode (FIG. 3A), or in a sampling mode (FIG. 3B). The sampling mode differs from the settling mode of FIG. 3A in that the switch 113 is closed in the sampling mode. Thus, the switches configuration of FIG. 3B is the same as in FIG. 3A except that switch 113 is closed.

In the following, further details regarding FIG. 2, FIG. 3A and FIG. 3B are explained:

The controller 5 may be configured to control the number of switches 122, 132, 133 such that the prebiasing circuit 130 is connected to the first node 161 as long as the comparison result R indicates that the first current I1 is smaller than the second current I2 (see FIG. 2, prebiasing mode). Furthermore, if the comparison result R indicates that the first current I1 is greater than or equal to the second current I2, the controller 5 may control the number of switches 122, 132, 133 such that the settling circuit 120 is connected to the first node 161 and the prebiasing circuit 130 is disconnected from the first node 161 and second node 162 (see FIG. 3, settling mode).

In particular, during the prebiasing phase according to FIG. 2, the controller 5 is configured to feed a number N of gradual rising biasing voltages V0 to the prebiasing circuit 130, namely to the positive input of the voltage regulator 131. In particular, the number N of gradual rising biasing voltages V0 includes a minimum biasing voltage corresponding to a maximum voltage allowed for the cell state having the lowest resistance value, a maximum biasing voltage corresponding to a maximum sensing voltage and N−2 gradual voltage steps between the minimum biasing voltage and the maximum biasing voltage.

The prebiasing operation may be explained as follows: A first biasing voltage V0 is applied through the voltage regulator 131. After a certain small number of clock cycles of prebiasing, it is checked using the voltage comparator 134 whether the current I1 flowing through the resistive memory cell 200 and the resistor 150 is higher or lower than the second current I2. If the first current I1 is higher than the second current I2, the prebiasing is over and the voltage regulator 131 is disconnected from the first node 161. After that, the final settling over the bitline BL according to FIG. 3A occurs. On the other side, if the current I1 is lower than the second current I2, the next biasing voltage V0, the second biasing voltage, is applied and above-mentioned steps of prebiasing and comparing are repeated.

After (N−1)—the biasing voltage steps are applied and the current I1 through the resistive memory cell 200 and the resistor 150 is still lower than the second current I2, the final prebiasing voltage is applied. After that, the final settling over the bitline BL according to FIG. 3A occurs.

Figure 4:
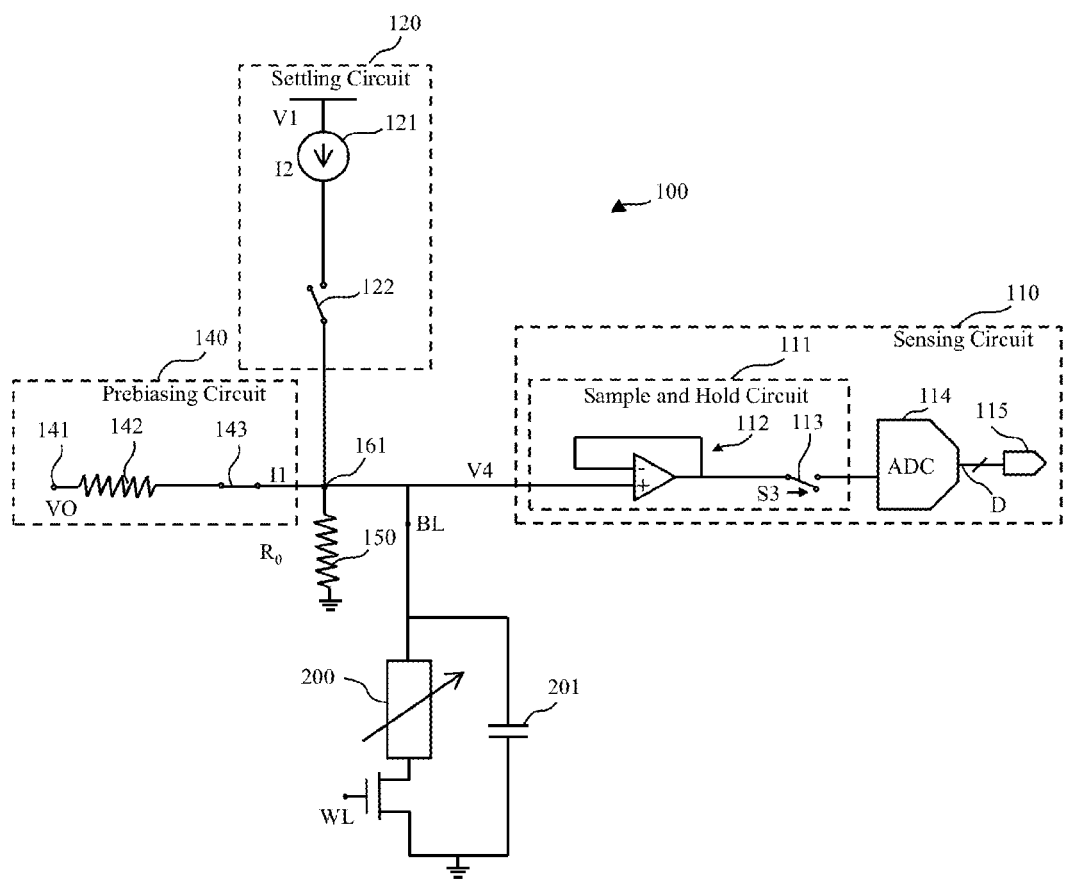
FIG. 4 shows a second embodiment of a device for determining an actual cell state of a resistive memory cell in a prebiasing mode in accordance with the present principles.

FIG. 4 shows a second embodiment of a device 100 for determining an actual cell state of a resistive memory cell 200 in a prebiasing mode. The second embodiment of FIG. 4 differs from the first embodiment of FIGS. 2 and 3 in the arrangement of the prebiasing circuit 140. The prebiasing circuit 140 of FIG. 4 includes a serial connection of a voltage source 141 for providing the prebiasing voltage V0, a resistor 142 and a switch 143 for connecting and disconnecting the prebiasing circuit 140 to the first node 161. In particular, the resistor 142 of the prebiasing circuit 140 may have equal or lower resistance to the resistor 150 coupled in parallel to the resistive memory cell 200 and the resistor 142.

Figure 5:
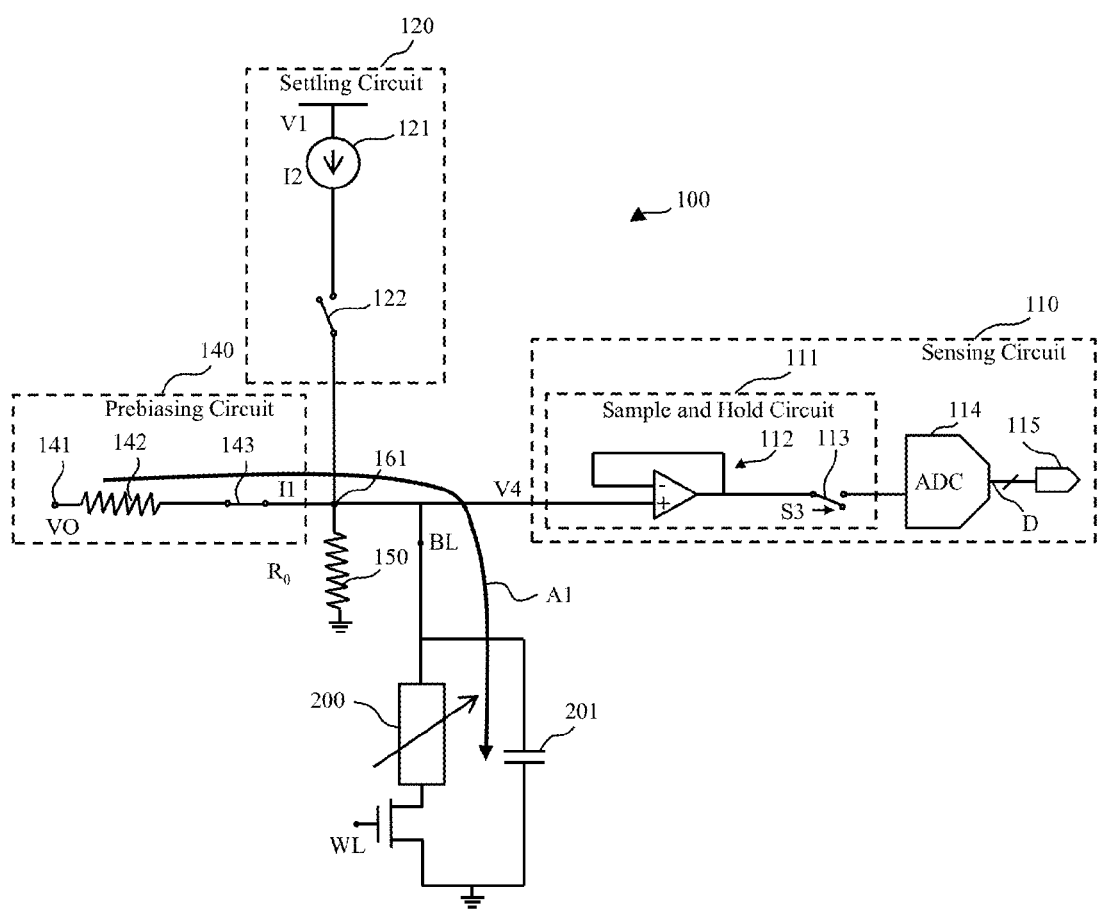
FIG. 5 shows the second embodiment of the device of FIG. 4 in the prebiasing mode in accordance with the present principles.
Figure 6:
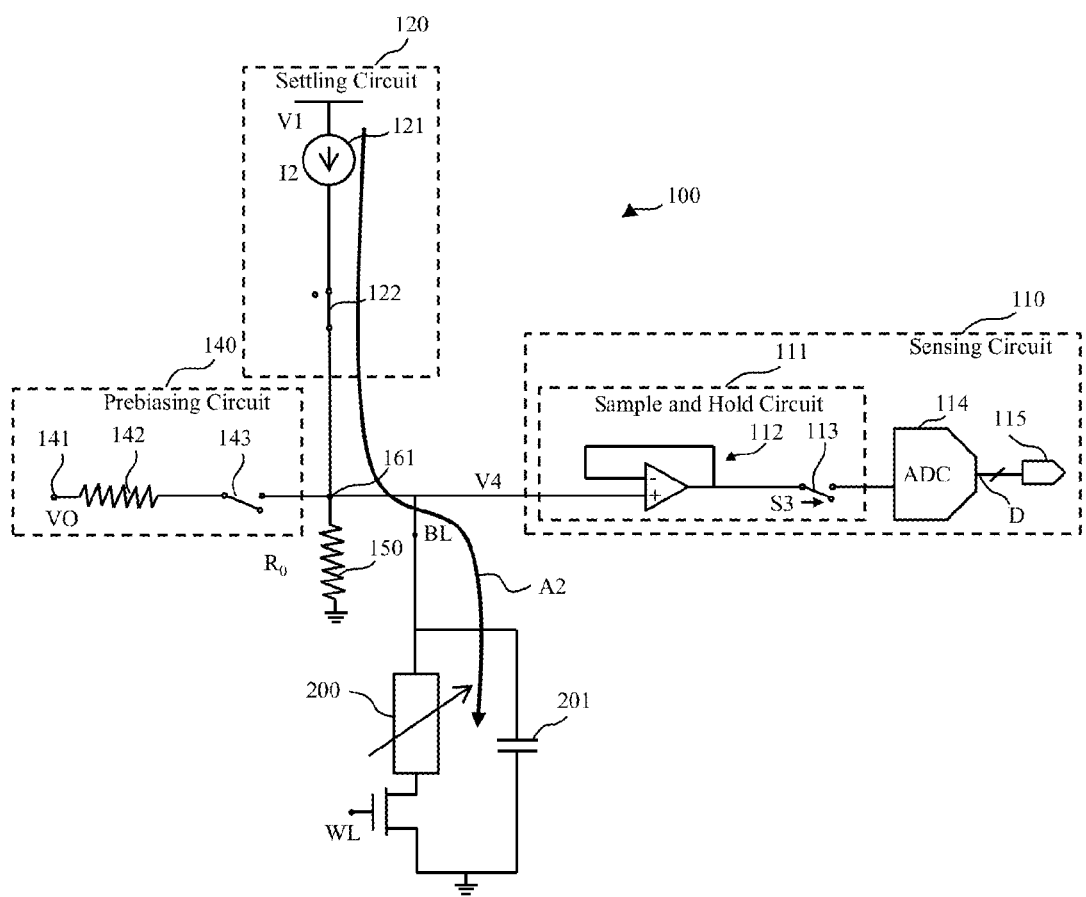
FIG. 6 shows the second embodiment of the device of FIG. 4 in a settling mode in accordance with the present principles.
Figure 7:
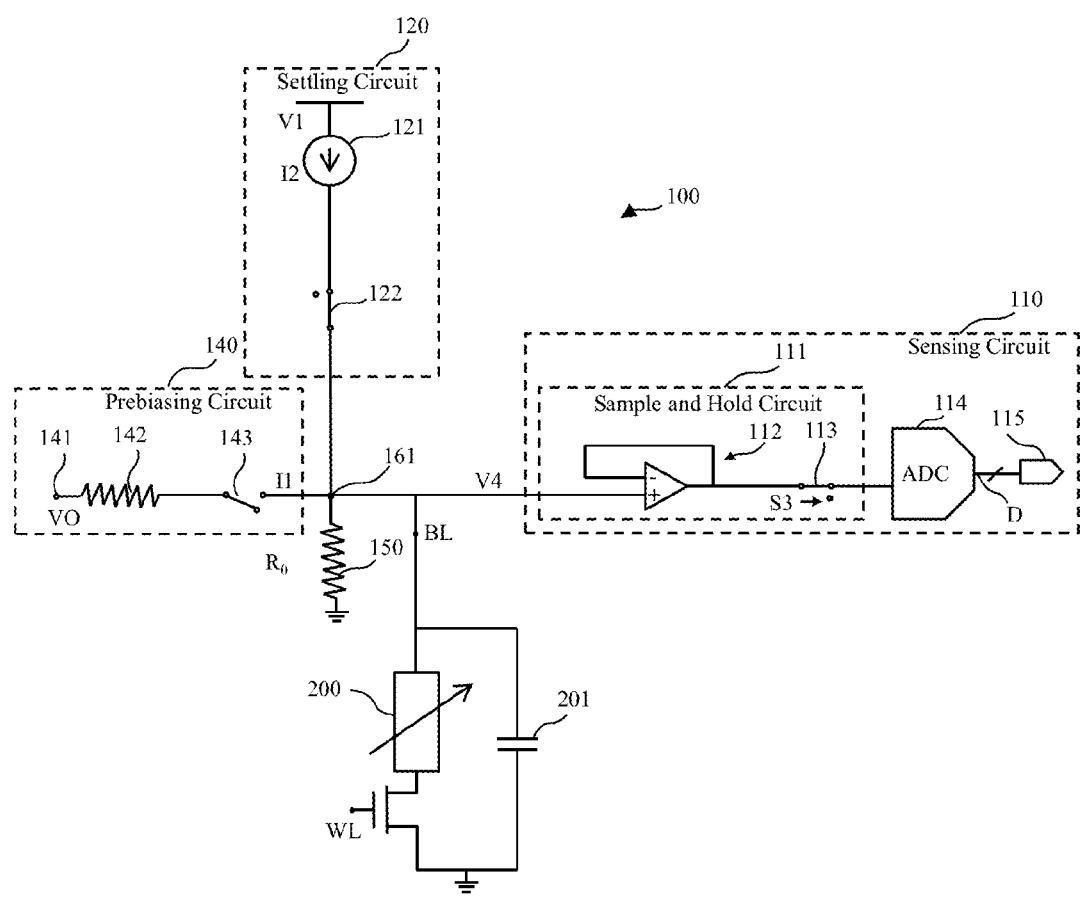
FIG. 7 shows the second embodiment of the device of FIG. 4 in a sampling mode in accordance with the present principles.

Further, FIGS. 5-7 show the second embodiment of the device 100 in different operating modes.

FIG. 5 shows the device 100 in the prebiasing mode. In the prebiasing mode, the switch 122 is opened, the switch 143 is closed and the switch 113 is opened. In FIG. 5, the current flows from the voltage source 141 over the first node 161 to the bitline BL and therefore to the resistive memory cell 200. The current flow in FIG. 5 is shown by arrow A1.

Further, in the settling mode according to FIG. 6, the switch 143 is opened, the switch 122 is closed and the switch 113 is open. As a result, the current flows from the current mirror 121 to the resistive memory cell 200 over the first node 161 and the bitline BL. The current flow in FIG. 6 is shown by arrow A2.

In FIG. 7, the device 100 is in a sampling mode. In the sampling mode, the switch 143 is opened, the switch 122 is closed and the switch 113 is closed. The controller controls the sampling by the third control signal S3 applied to switch 113.

Figure 8:
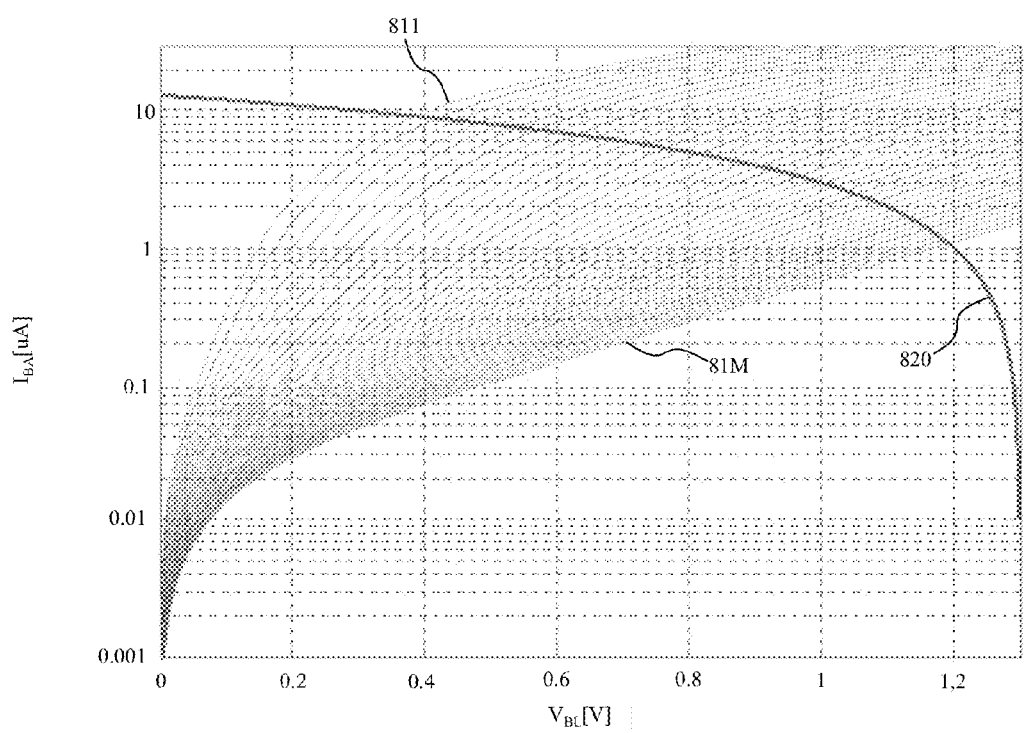
FIG. 8 shows I-V characteristics of the cell states of a PCM cell and a detection curve for reading the cell states in accordance with the present principles.

FIG. 8 depicts I/V characteristics of the cell states of a PCM cell and a detection curve for reading the cell states. The different cell states of the PCM cell are shown by curves 811-81M. The curve 811 shows the cell state with the lowest resistance value of the PCM cell, wherein curve 81M shows the cell state having the highest resistance value. Further, FIG. 8 shows the detection curve 820 for reading the cell states 801-81M of the PCM cell.

The detection curve 820 is a function of the resistance value R0 of the resistor 150: I3=I2−V4/R0, where V4 is a sensing voltage and I3 is the current flowing through PCM cell only.

Thus, the detection curve 820 depends on R0 with the effect of minimizing the settling time.

Figure 9:
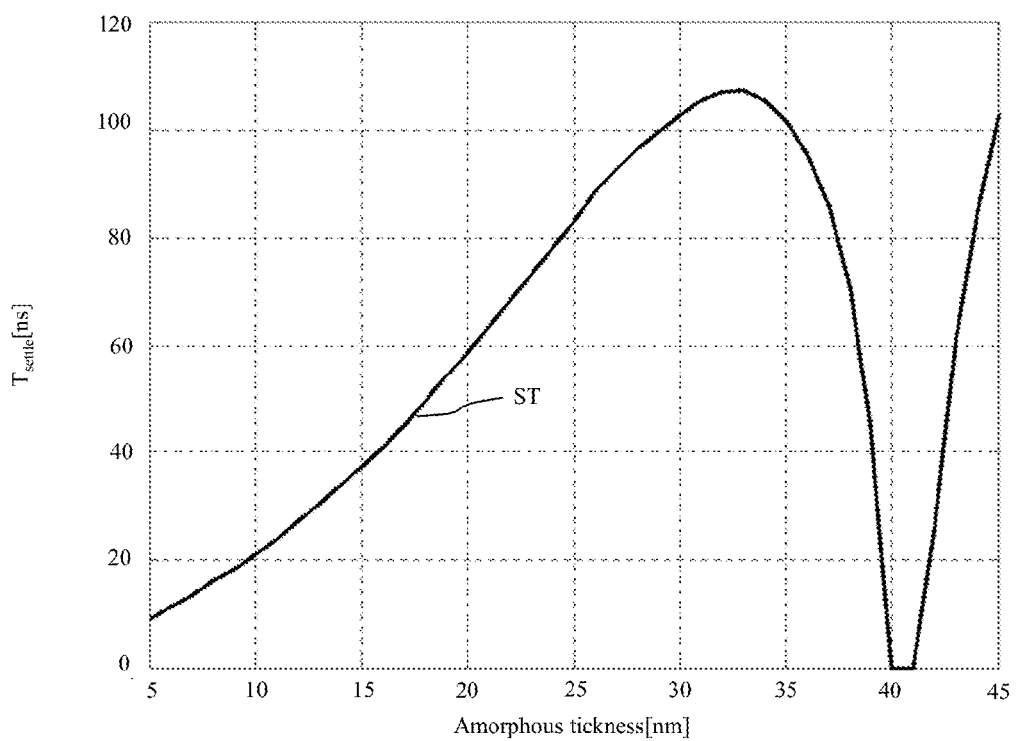
FIG. 9 shows a diagram illustrating the settling time in accordance with the present principles.

FIG. 9 shows a diagram illustrating the settling time ST in order to get 0.5 LSB accuracy. FIG. 9 shows that the minimum of the settling time ST is near the highest resistance voltage of the cell corresponding to highest amorphous thickness.

Figure 10:
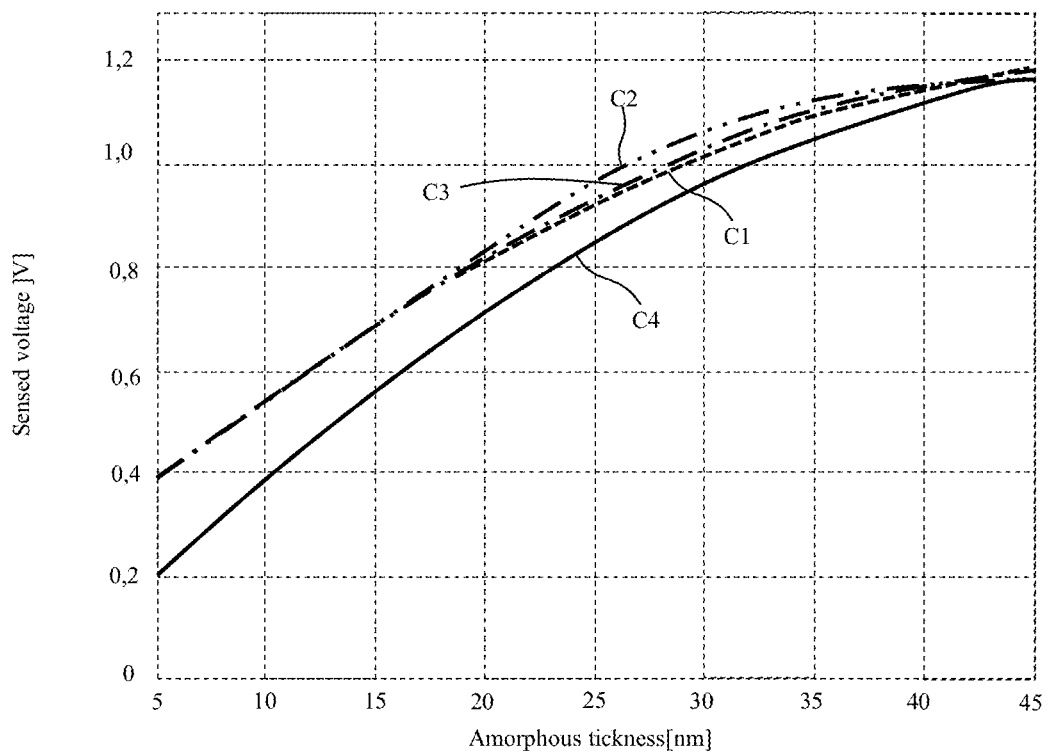
FIG. 10 shows a diagram illustrating the sensing voltages for different settling times in accordance with the present principles.

FIG. 10 shows a diagram illustrating the sensing voltages VM for different settling times. In FIG. 10, curve C1 shows the sensing voltage V4 after infinite settling time which is equal to a certain target voltage, curve C2 shows the sensing voltage V4 with a settling time of 50 ns, curve C3 shows the sensing voltage V4 with a settling time of 100 ns and curve C4 shows the voltage at the PCM cell. In the light of FIG. 10, it comes clear that is not necessary to wait for the full settling time (e.g., 100 ns) for 0.5 LSB accuracy. For a shorter settling time of 50 ns, only the detection curve shape changes in a favorable way in terms of noise suppression having higher sensing current for intermediate values.

For example, the total latency time using the present realization may be 200 ns in sum:

90 ns for the prebiasing steps;
50 ns settling time; and
60 ns for the analog-to-digital conversion.

Figure 11:
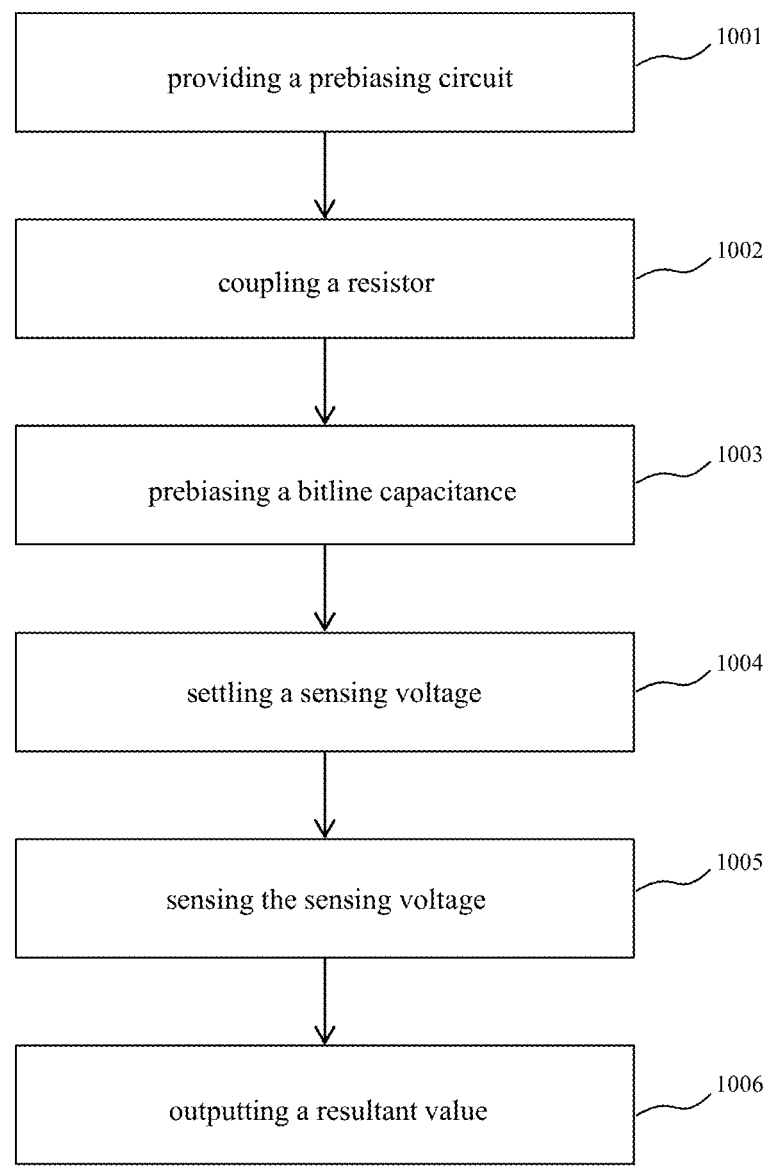
FIG. 11 shows an embodiment of a sequence of method steps for determining an actual cell state of a resistive memory cell having a plurality of programmable cell states in accordance with the present principles.

FIG. 11 shows an embodiment of a sequence of method steps for determining an actual cell state of a resistive memory cell having a plurality M of programmable cell states.

In step 1001, a resistor is coupled in parallel to the resistive memory cell such that the resistor is configured to reduce an effective resistance seen by the prebiasing circuit.

In step 1002, a prebiasing circuit is coupled to the resistive memory cell.

In step 1003, a bitline capacitance of the resistive memory cell is prebiased by the prebiasing circuit such that a sensing voltage of the resistive memory cell is close to a certain target voltage which is indicative for the actual cell state.

In step 1004, the sensing voltage is settled to the certain target voltage.

In step 1005, the sensing voltage of the resistive memory cell is sensed by a sensing circuit.

In step 1006, a resultant value is output in response to the sensing voltage.

Computerized devices may be suitably designed for implementing embodiments of the present invention as described herein. In that respect, it may be appreciated that the methods described herein are largely non-interactive and automated. In exemplary embodiments, the methods described herein may be implemented either in an interactive, partly-interactive or non-interactive system. The methods described herein may be implemented in software (e.g., firmware), hardware, or a combination thereof. In exemplary embodiments, the methods described herein are implemented in software, as an executable program, the latter executed by suitable digital processing devices. In further exemplary embodiments, at least one step or all steps of the above described method of FIG. 11 may be implemented in software, as an executable program, the latter executed by suitable digital processing devices. More generally, embodiments of the present invention may be implemented wherein general-purpose digital computers, such as personal computers, workstations, etc., are used.

Figure 12:
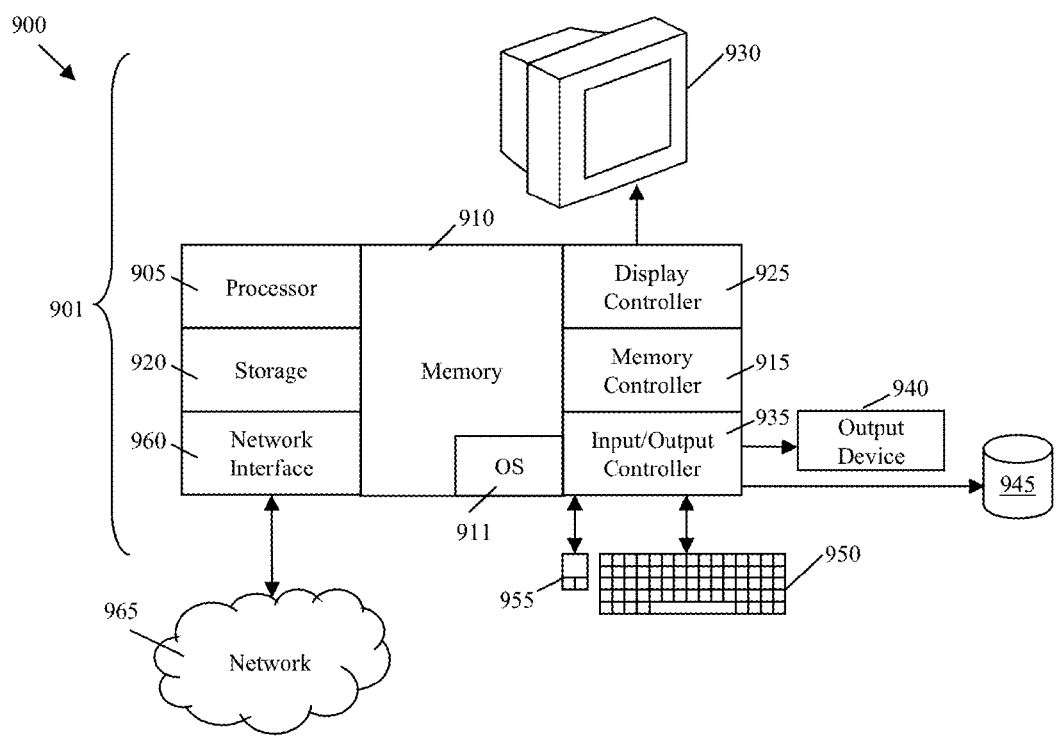
FIG. 12 shows a schematic block diagram of an embodiment of a system adapted for performing the method for read measurement of a plurality of resistive memory in accordance with the present principles.

For instance, the system 900 depicted in FIG. 12 schematically represents a computerized unit 901, e.g., a general-purpose computer. In exemplary embodiments, in terms of hardware architecture, as shown in FIG. 12, the unit 901 includes a processor 905, memory 910 coupled to a memory controller 915, and one or more input and/or output ("I/O") devices 940, 945, 950, 955 (or peripherals) that are communicatively coupled via a local input/output controller 935. Further, the input/output controller 935 may be, but is not limited to, one or more buses or other wired or wireless connections, as is known in the art. The input/output controller 935 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor 905 is a hardware device for executing software, particularly that stored in memory 910. The processor 905 may be any custom made or commercially available processor, a central processing unit ("CPU"), an auxiliary processor among several processors associated with the computer 901, a semiconductor based microprocessor (in the form of a microchip or chip set), or generally any device for executing software instructions.

The memory 910 may include any one or combination of volatile memory elements (e.g., random access memory) and nonvolatile memory elements. Moreover, the memory 910 may incorporate electronic, magnetic, optical, and/or other types of storage media. Note that the memory 910 may have a distributed architecture, where various components are situated remote from one another, but may be accessed by the processor 905.

The software in memory 910 may include one or more separate programs, each of which comprises an ordered listing of executable instructions for implementing logical functions. In the example of FIG. 12, the software in the memory 910 includes methods described herein in accordance with exemplary embodiments and a suitable operating system ("OS") 911. The OS 911 essentially controls the execution of other computer programs, such as the methods as described herein (e.g., FIG. 11), and provides scheduling, input-output control, file and data management, memory management, and communication control and related services.

The methods described herein may be in the form of a source program, executable program (object code), script, or any other entity comprising a set of instructions to be performed. When in a source program form, then the program needs to be translated via a compiler, assembler, interpreter, or the like, as known per se, which may or may not be included within the memory 910, so as to operate properly in connection with the OS 911. Furthermore, the methods may be written as an object oriented programming language, which has classes of data and methods, or a procedure programming language, which has routines, subroutines, and/or functions.

Possibly, a conventional keyboard 950 and mouse 955 may be coupled to the input/output controller 935. Other I/O devices 940-955 may include sensors (especially in the case of network elements), i.e., hardware devices that produce a measurable response to a change in a physical condition like temperature or pressure (physical data to be monitored). Typically, the analog signal produced by the sensors is digitized by an analog-to-digital converter and sent to controllers 935 for further processing. Sensor nodes are ideally small, consume low energy, are autonomous and operate unattended.

In addition, the I/O devices 940-955 may further include devices that communicate both inputs and outputs. The system 900 may further include a display controller 925 coupled to a display 930. In exemplary embodiments, the system 900 may further include a network interface or transceiver 960 for coupling to a network 965.

The network 965 transmits and receives data between the unit 901 and external systems. The network 965 is possibly implemented in a wireless fashion, e.g., using wireless protocols and technologies, such as WiFi, WiMax, etc. The network 965 may be a fixed wireless network, a wireless local area network ("LAN"), a wireless wide area network ("WAN") a personal area network ("PAN"), a virtual private network ("VPN"), intranet or other suitable network system and includes equipment for receiving and transmitting signals.

The network 965 may also be an IP-based network for communication between the unit 901 and any external server, client and the like via a broadband connection. In exemplary embodiments, network 965 may be a managed IP network administered by a service provider. Besides, the network 965 may be a packet-switched network such as a LAN, WAN, Internet network, etc.

If the unit 901 is a PC, workstation, intelligent device or the like, the software in the memory 910 may further include a basic input output system ("BIOS"). The BIOS is stored in ROM so that the BIOS may be executed when the computer 901 is activated.

When the unit 901 is in operation, the processor 905 is configured to execute software stored within the memory 910, to communicate data to and from the memory 910, and to generally control operations of the computer 901 pursuant to the software. The methods described herein and the OS 911, in whole or in part are read by the processor 905, typically buffered within the processor 905, and then executed. When the methods described herein (e.g., with reference to FIG. 11) are implemented in software, the methods may be stored on any computer readable medium, such as storage 920, for use by or in connection with any computer related system or method.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory ("RAM"), a read-only memory ("ROM"), an erasable programmable read-only memory ("EPROM" or Flash memory), a static random access memory ("SRAM"), a portable compact disc read-only memory ("CD-ROM"), a digital versatile disk ("DVD"), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture ("ISA") instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network ("LAN") or a wide area network ("WAN"), or the connection may be made to an external computer (for example, through the Internet using an Internet Service Provider). In some embodiments, electronic circuitry including, for example, programmable logic circuitry, field-programmable gate arrays ("FPGA"), or programmable logic arrays ("PLA") may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The invention claimed is:

1. A method for determining an actual cell state of a resistive memory cell having a plurality of programmable cell states, the method comprising:
   providing a prebiasing circuit;
   coupling a resistor in parallel to the resistive memory cell such that the resistor is configured to reduce an effective resistance seen by the prebiasing circuit;
   prebiasing a bitline capacitance of the resistive memory cell by the prebiasing circuit such that a sensing voltage of the resistive memory cell is close to a certain target voltage which is indicative of the actual cell state;
   settling the sensing voltage to the certain target voltage;
   sensing the sensing voltage of the resistive memory cell; and
   outputting a resultant value in response to the sensing voltage.

2. The method of claim 1, wherein a resistance of the resistor is at least five times smaller than a highest resistance value of the resistive memory cell.

3. The method of claim 1, wherein a resistance of the resistor is between five and fifteen times smaller than a highest resistance value of the resistive memory cell.

4. The method of claim 1, wherein the prebiasing circuit is coupled to a first node connected to a bitline of the resistive memory cell and to the resistor.

5. The method of claim 4, further comprising controlling a number of switches such that, during the prebiasing, the prebiasing circuit is connected to the first node and, during the settling, a settling circuit is connected to the first node and the prebiasing circuit is disconnected from the first node.

6. The method of claim 5, further comprising comparing a first current flowing through the resistive memory cell and the resistor coupled in parallel to the resistive memory cell and a second current provided by a current mirror of the settling circuit to provide a comparison result.

7. The method of claim 6, further comprising controlling the number of switches such that the prebiasing circuit is connected to the first node when the comparison result indicates that the first current is smaller than the second current and such that the settling circuit is connected to the first node and the prebiasing circuit is disconnected from the first node when the comparison result indicates that the first current is greater than or equal to the second current.

8. The method of claim 7, further comprising feeding, during the prebiasing, a number of gradual rising biasing voltages to the prebiasing circuit.

9. The method of claim 8, wherein the number of gradual rising biasing voltages includes a minimum biasing voltage corresponding to a maximum voltage allowed for the cell state having a lowest resistance value when the resistive memory cell is in a set state, a maximum biasing voltage corresponding to a maximum sensing voltage when the resistive memory cell is in a reset state, and gradual voltage steps between the minimum biasing voltage and the maximum biasing voltage.

10. The method of claim 6, wherein comparing the first current and the second current includes comparing an output voltage provided by the current mirror of the settling circuit and a reference voltage to provide the comparison result.

\* \* \* \* \*